United States Patent
Koch et al.

(10) Patent No.: US 10,564,551 B2
(45) Date of Patent: Feb. 18, 2020

(54) METHOD FOR DETERMINING A FOCUS POSITION OF A LITHOGRAPHY MASK AND METROLOGY SYSTEM FOR CARRYING OUT SUCH A METHOD

(71) Applicant: Carl Zeiss SMT GmbH, Oberkochen (DE)

(72) Inventors: Markus Koch, Neu-Ulm (DE); Dirk Hellweg, Langenau (DE); Renzo Capelli, Heidenheim (DE); Martin Dietzel, Giengen a. d. Brenz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/280,521

(22) Filed: Feb. 20, 2019

(65) Prior Publication Data

US 2019/0258180 A1    Aug. 22, 2019

(30) Foreign Application Priority Data

Feb. 21, 2018   (DE) ........................ 10 2018 202 637

(51) Int. Cl.
*G03B 27/52* (2006.01)
*G03F 7/20* (2006.01)
*G03F 1/00* (2012.01)

(52) U.S. Cl.
CPC ........ *G03F 7/70483* (2013.01); *G03F 1/0092* (2013.01); *G03F 7/705* (2013.01);
(Continued)

(58) Field of Classification Search
CPC ... G02B 27/48; G03F 1/0092; G03F 7/70616; G03F 7/70641; G03F 7/70625; G03F 7/70666; G03F 7/7055; G03F 7/70583; G03F 7/70091; G03F 7/7085; G03F 7/70283; G03F 7/703; G03F 7/70325; G03F 7/70333; G03F 7/705; G03F 7/70508; G03F 7/70516; G03F 7/70525; G03F 7/70533; G03F 7/70483; G03F 7/70491; G03F 7/70991; G03F 7/70541; G03F 7/70591; G03F 7/7065; G03F 7/70775
(Continued)

(56) References Cited

U.S. PATENT DOCUMENTS 10,068,325 B2   9/2018  Matejka et al.
2005/0231699 A1* 10/2005 Butler ................. G03F 7/70508
                                                        355/55
(Continued)

FOREIGN PATENT DOCUMENTS

| DE | 102 20 815 | 11/2003 | ............ G21K 7/00 |
| DE | 102 20 816 | 11/2003 | ............ G21K 7/00 |
| WO | WO 2016/012426 | 1/2016 | ............ G02B 17/08 |

OTHER PUBLICATIONS

German Examination Report for German Application No. DE 10 2018 202 637.8 dated Oct. 22, 2018 (with English Translation).
(Continued)

*Primary Examiner* — Christina A Riddle
(74) *Attorney, Agent, or Firm* — Fish & Richardson P.C.

(57) ABSTRACT

For determining a focus position of a lithography mask (e.g., 5), a focus stack of a measurement region free of structures to be imaged is recorded and the speckle patterns of the recorded images are evaluated.

19 Claims, 5 Drawing Sheets

(52) U.S. Cl.
CPC ...... *G03F 7/70091* (2013.01); *G03F 7/70583* (2013.01); *G03F 7/70591* (2013.01); *G03F 7/70641* (2013.01); *G03F 7/70666* (2013.01); *G03F 7/70775* (2013.01)

(58) Field of Classification Search
USPC ...... 355/30, 52, 53, 67–71, 75–77; 356/396, 356/237.2, 498, 512; 250/492.1, 492.2, 250/492.22, 493.1, 504 R
See application file for complete search history.

(56) References Cited

U.S. PATENT DOCUMENTS

| | | |
|---|---|---|
| 2013/0063716 A1 | 3/2013 | Mann et al. |
| 2013/0083321 A1 | 4/2013 | Wack et al. |
| 2013/0156939 A1* | 6/2013 | Budach ................ B82Y 10/00 427/8 |
| 2016/0028936 A1 | 1/2016 | Saphier et al. |
| 2016/0341630 A1 | 11/2016 | Sogard |
| 2017/0018064 A1* | 1/2017 | Seidel ................... G06T 7/001 |

OTHER PUBLICATIONS

Claus et al. "Aberration estimation using EUV mask roughness," Extreme Ultraviolet (EUV) Lithography VI, Feb. 23-26, 2015, San Jose, California, USA. Bellingham, Wash.; Proceedings of SPIE; vol. 9422, pp. 942212-1-942214-6, (Mar. 19, 2015).
Hellweg et al., "Actinic Review of EUV Masks: Performance Data and Status of the AIMS™ EUV System," Jun. 3, 2017, Zeiss, "https://www.zeiss.com/content/dam/smt/downloads/products_and_solutions/photomask-systems/Publications/spie_2017_paper.pdr".

* cited by examiner

METHOD FOR DETERMINING A FOCUS POSITION OF A LITHOGRAPHY MASK AND METROLOGY SYSTEM FOR CARRYING OUT SUCH A METHOD

CROSS REFERENCE TO RELATED APPLICATION

This application claims priority under 35 U.S.C. § 119 to German Application DE 10 2018 202 637.8, filed on Feb. 21, 2018, the entire content of which is incorporated herein by reference.

TECHNICAL FIELD

The invention relates to a method for determining a focus position of a lithography mask. The invention additionally relates to a metrology system for carrying out such a method.

BACKGROUND

In order to inspect lithography masks or mask blanks, that is to say blanks for producing lithography masks, they have to be brought to their focus position in the metrology system. A focus stack of a specific test structure on the mask is usually recorded for this purpose. However, this is not always possible. A further disadvantage of the known methods is that the results are often not reliably reproducible. They may depend in particular on the test structure, the illumination setting and a more or less arbitrarily predefinable contrast criterion. Moreover, the customary methods do not function if coherent illumination settings with a low pupil filling coefficient are used for illuminating the mask.

SUMMARY

A method would be ideal which directly minimizes the wavefront aberrations caused by the defocus and is thus independent of the used structures and illumination properties.

In a general aspect of the present invention, a method for determining the focus position of a lithography mask is improved.

The aspect is achieved by means of the features of a method for determining a focus position of a lithography mask. The method includes the following steps: providing an optical system having an imaging optical unit for imaging lithography masks, providing a lithography mask having at least one measurement region which is free of structures to be imaged, recording a focus stack of the at least one measurement region of the lithography mask, evaluating 2D intensity distributions ($15_{zi}$) of the recorded focus stack in a spatially resolved manner, wherein evaluating the 2D intensity distributions ($15_{zi}$) includes ascertaining the speckle contrast, and wherein evaluating the 2D intensity distributions ($15m$) includes ascertaining a focus position (z) for which the speckle contrast has a minimum.

The heart of the invention consists in recording and evaluating the intensity distributions of the aerial images of a measurement region which is free of structures to be imaged.

The measurement region is, in particular, a purely reflective region or an exclusively absorbent region.

The lithography mask can be, in particular, a mask blank, that is to say a substrate for producing a lithography mask. Blanks of this type are likewise referred to hereinafter as lithography mask.

It has been recognized according to the invention that evaluating the aerial images of a structure-free measurement region enables the focus position of the lithography mask to be ascertained particularly simply and robustly.

The focus stack comprises in particular at least two, in particular at least three, in particular at least four, in particular at least five, recordings of the at least one measurement region in different measurement planes, that is to say with varying defocus.

It has been recognized according to the invention that it is possible, by means of a speckle pattern measurement, in the context of a 3D aerial image measurement which is regularly carried out anyway during a lithography mask measurement, to separate an imaging aberration contribution from a mask structure contribution to the speckle pattern. The imaging aberration contribution can then be represented, with the result that from this a qualification of the imaging optical unit can be carried out and, in particular, conclusions can be drawn regarding the extent to which said imaging aberration contribution can be reduced for example by means of a readjustment of the imaging optical unit of the metrology system. A separation can be carried out by means of determining a z-position of an intersection point of a profile of the focus dependence of the real part and the imaginary part of the respective spectral component. The method can be used to determine in particular aberrations which can be described by use of even functions.

The imaging optical unit can be part of a metrology system, in particular for the qualification of lithography masks and of still unstructured mask substrates, so-called mask blanks. A qualification of mask blanks, that is to say an assessment of the quality of still unstructured masks, can also be carried out with the aid of the determining method.

The defocus aberration can be calculated from a known illumination angle distribution (illumination setting) during the illumination of the measured lithography mask and also a known transmission function of the imaging optical unit. The transmission function can be a pupil transmission function. The pupil transmission function can be a binary function and have the value 1 for spatial frequencies within a numerical aperture of the imaging optical unit and 0 for spatial frequencies outside said numerical aperture.

It has been recognized according to the invention, in particular, that the best focus position of the lithography mask can be ascertained in a simple manner from the evaluation of the speckle pattern brought about by the inherent optical roughness of the mask.

In accordance with one aspect of the invention, evaluating the 2D intensity distributions comprises ascertaining the speckle contrast. The term speckle contrast denotes, in particular, the variance of the aerial image.

In accordance with a further aspect of the invention, evaluating the 2D intensity distributions comprises ascertaining a focus position for which the speckle contrast has a minimum. In particular, an interpolation method can be provided for this purpose.

It has been recognized according to the invention that the speckle contrast has a minimum in the best focus position.

In accordance with a further aspect of the invention, evaluating the 2D intensity distributions comprises the following steps:

determining a spectrum $S(\vec{v})$ of the 2D intensity distributions by Fourier transformation of the 2D intensity distributions, determining a focus dependence of a real part RS(z) and an imaginary part IS(z) of a plurality of spectral components $S(v_{xi}, v_{yi})$ of the spectrum $S(\vec{v})$ in the frequency domain, separating an imaging aberration contribution Θ made to the spectrum $S(\vec{v})$ by the imaging optical unit, and representing the imaging aberration contribution Θ as a linear combination of Zernike polynomials.

It has been recognized according to the invention that a structure-independent imaging aberration contribution made to the spectrum by the imaging optical unit can be separated from the analysis of the focus dependence of the real part and the imaginary part of the spectral components of the spectrum of the 2D intensity distributions in the frequency domain.

In accordance with a further aspect of the invention, representing the imaging aberration contribution comprises ascertaining Zernike coefficients $Z_n$.

In particular, a linear regression method (Least Square Fit) can be used for ascertaining the mirror-symmetrical Zernike coefficients $Z_n$.

The defocus can be ascertained in particular directly from the fourth Zernike coefficient.

Advantageously, evaluating the 2D intensity distributions comprises exclusively Fourier transformations and linear algebra. It is therefore implementable in a particularly simple manner. The method is particularly robust, in particular.

In accordance with one aspect of the invention, a mirror-symmetrical illumination setting is used for illuminating the measurement region. This can involve, in particular, an illumination setting which is provided later for the imaging of the mask in a projection exposure apparatus.

In accordance with a further aspect of the invention, at least partially coherent illumination radiation is used for illuminating the measurement region.

In particular, a mirror-symmetrical illumination setting is used for illuminating the measurement region. The illumination setting is mirror-symmetrical in particular within the numerical aperture, that is to say σ≤1.

In accordance with a further aspect of the invention, coherent illumination radiation is used for illuminating the measurement region. This is not possible in many of the hitherto known methods for determining the focus position.

in another generate aspect of the invention, a metrology system for carrying out the method described above is provided.

This aspect is achieved by use of a metrology system comprising an illumination optical unit for illuminating the measurement region with illumination radiation and comprising an imaging optical unit for imaging the measurement region onto a spatially resolving detection device.

In accordance with a further aspect of the invention, for evaluating the 2D intensity distributions of the recorded focus stack, a computing device is connected to the detection device in a data-transferring manner.

The evaluation of the recorded intensity distributions can be carried out in particular in an automated manner.

BRIEF DESCRIPTION OF DRAWINGS

Further details and advantages of the invention will become apparent from the description of an exemplary embodiment with reference to the figures. In the figures.

DETAILED DESCRIPTION

Figure 1:
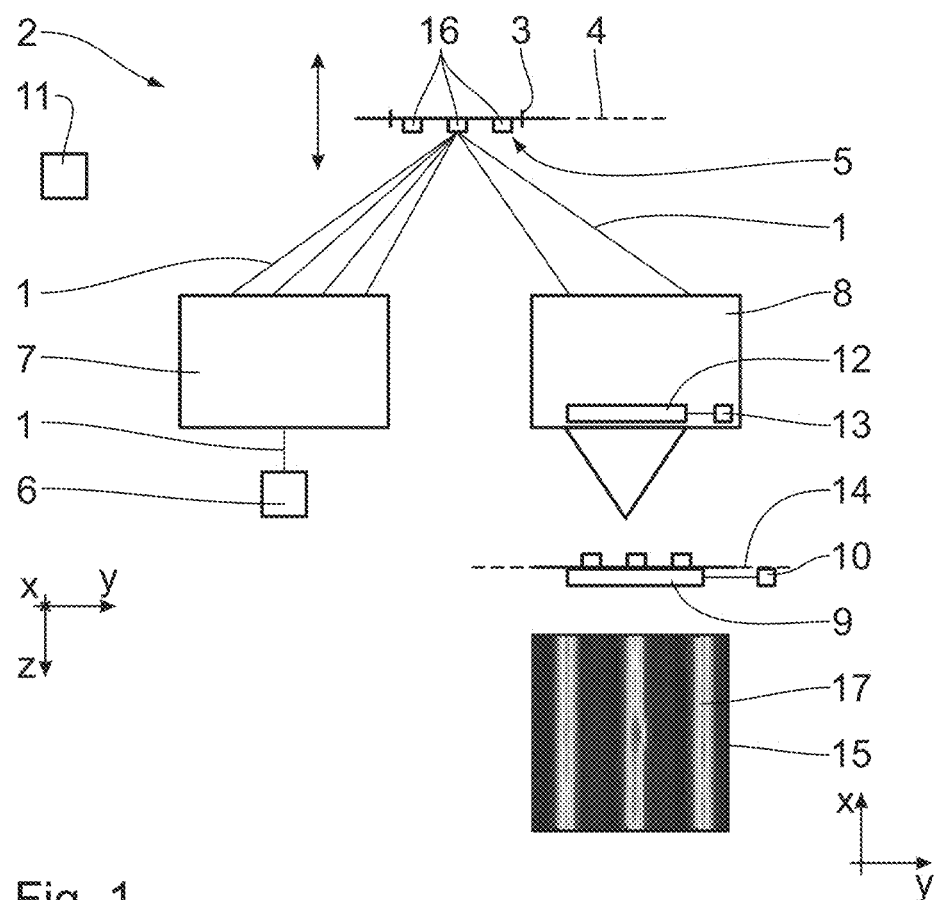
FIG. 1 shows highly schematically, in a plan view looking in a direction perpendicular to a plane of incidence, a metrology system for the examination of an object in the form of a lithography mask with EUV illumination and imaging light with an illumination optical unit and an imaging optical unit, each of which is illustrated extremely schematically.

In order to facilitate the presentation of positional relationships, a Cartesian xyz-coordinate system is used hereinafter. In FIG. 1, the x-axis runs perpendicularly to the plane of the drawing into the latter. The y-axis runs towards the right in FIG. 1. The z-axis runs downwards in FIG. 1.

FIG. 1 shows in a view corresponding to a meridional section a beam path of EUV illumination light and imaging light 1 in a metrology system 2 for the examination of an object 5, arranged in an object field 3 in an object plane 4, in the form of a reticle or a lithography mask or a mask blank with the EUV illumination light 1. The metrology system 2 is used for analyzing a three-dimensional (3D) aerial image (Aerial Image Metrology System) and serves for simulating and analyzing the effects of properties of lithography masks, known as reticles, which in turn are used during projection exposure for producing semiconductor components, on the optical imaging by projection optical units within a projection exposure apparatus. Such systems are known from WO 2016/012426 A1 (cf. FIG. 1 therein), from US 2013/0063716 A1 (cf. FIG. 3 therein), from DE 102 20 815 A1 (cf. FIG. 9 therein) and from DE 102 20 816 A1 (cf. FIG. 2 therein) and from US 2013/0083321 A1.

The illumination light 1 is reflected at the object 5. A plane of incidence of the illumination light 1 lies parallel to the yz-plane.

For example, the EUV illumination light 1 is produced by an EUV light source 6. For example, the light source 6 may be a laser plasma source (LPP; laser produced plasma) or a discharge source (DPP; discharge produced plasma). In principle, a synchrotron-based light source may also be used, for example a free electron laser (FEL). A used wavelength of the EUV light source may lie in the range between, e.g., 5 nm and 30 nm. In principle, in the case of a variant of the metrology system 2, a light source for another used light wavelength may also be used instead of the light source 6, for example a light source for a used wavelength of 193 nm.

Depending on the embodiment of the metrology system 2, it may be used for a reflective or for a transmissive object 5. One example of a transmissive object is a phase mask.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle distribution with which the field points of the object field 3 are illuminated.

For example, a numerical aperture of the illumination and imaging light 1 of the metrology system 2 is 0.0825 on the reticle side. The object field 3 in the object plane 4 has an extent of, e.g., 8 μm in the x-direction and of 8 μm in the y-direction, that is to say is square.

After reflection at the object 5, the illumination and imaging light 1 enters an imaging optical unit or projection optical unit 8 of the metrology system 2, which is likewise indicated schematically in FIG. 1. The imaging optical unit 8 serves for imaging the object 5 towards a spatially resolving detection device 9 of the metrology system 2. The detection device 9 is designed, e.g. as a CCD detector or CMOS detector.

The detection device 9 is signal-connected to a digital computing device in the form of an image processing device 10.

The object 5 is carried by an object holder (not illustrated). Said object holder can be displaced by use of a displacement drive on the one hand parallel to the xy-plane and on the other hand perpendicular to this plane, that is to say in the z-direction. The displacement drive, and likewise the entire operation of the metrology system 2, is controlled by a central control device 11, which, in a manner not illustrated in more specific detail, is signal-connected to the components to be controlled.

By way of example, FIG. 1 illustrates an imaging component 12 of the imaging optical unit 8, which can be a mirror or, with the use of illumination light wavelengths longer than EUV wavelengths, a lens element. The imaging component 12 is operatively connected to a displacement actuator 13, which is in turn signal-connected to the control device 11. By use of the displacement actuator 13, the imaging component 12 can be displaced independently of one another in the x-direction and/or in the y-direction and/or in the z-direction for the precise alignment of the imaging component 12. A spatial resolution of this displacement can be better than 10 μm and can in particular be better than 2 μm.

A magnification factor of the imaging optical unit 8 is greater than 500, and is 850 in the exemplary embodiment according to FIG. 1. A resulting image-side numerical aperture in the region of an image plane 14, in which a 3D aerial image of the object 5 arises, is in the region of $1\cdot10^{-4}$.

Below the detection device 9, a plan view of a 2D intensity distribution 15 in a measurement plane (e.g. z=0) is represented by way of example in FIG. 1. Structures 16 on the reticle 5 are represented as intensity maxima 17 running in the x-direction.

Figure 2:
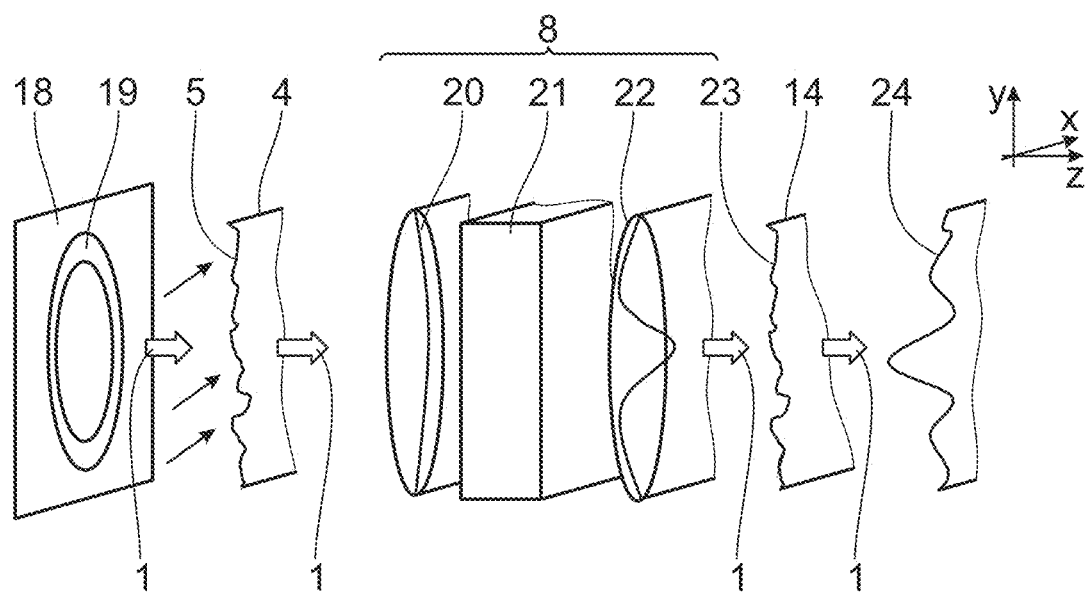
FIG. 2 schematically shows a propagation of the illumination and imaging light between an illumination pupil and an aerial image in the region of an image plane of the imaging optical unit, wherein a conversion of the aerial image into a spectrum of a speckle pattern is additionally illustrated as well.

FIG. 2 schematically shows a propagation of the illumination and imaging light 1 from a pupil plane 18 of the illumination optical unit 7 right into the region of the image plane 14. The variables or components respectively considered are indicated perspectively in the xyz-coordinate system. A pupil intensity distribution 19 of the illumination light 1 is present in the pupil plane 18, said distribution also being referred to as an illumination setting. A ring-shaped or annular pupil intensity distribution 19 is illustrated by way of example. The pupil intensity distribution 19 is represented mathematically as $\alpha(\kappa)$.

In this case, $\sigma$ is the illumination intensity and $\kappa$ describes the location at which said illumination intensity is present, in pupil coordinates.

The illumination light 1 propagates from the pupil plane 18 into the object plane 4, where the illumination light 1 is incident on the object 5, which has a roughness illustrated in an exaggerated fashion in FIG. 2. This results in a wavefront $$\frac{4\pi}{\lambda}h(\vec{r}) + \vec{r}\vec{\kappa}$$

and a field distribution of the illumination light 1, which can be written as $$\varphi(\vec{r},\vec{\kappa}) \sim \left(1 + i\frac{4\pi}{\lambda}h(\vec{r})\right)e^{i\vec{r}\vec{\kappa}}$$

The designations here have the following meanings:
$\vec{r}$: Spatial coordinate vector having coordinates xy;
$\lambda$: Wavelength of the illumination light;
h: Roughness of the object (sagittal height in the z-direction).

After being reflected at or passing through the object 5, the illumination light 1 propagates through an entrance pupil 20 of the imaging optical unit 8, the imaging components of which are indicated at 21 in FIG. 2, and afterwards through an exit pupil 22. Afterwards, the object 5 is imaged into an aerial image 23 in the region of the image plane 14. A Fourier transformation of the respective 2D intensity distribution in the x- and y-directions, that is to say of a "slice" of the aerial image 23, yields a speckle spectrum 24, that is to say a spectrum $S(\vec{v})$ of a speckle pattern of the aerial image 23. The following holds true for said speckle spectrum:

$$S(\vec{v}) \approx -\frac{8\pi}{\lambda}H(\vec{v})\Theta(\vec{v})$$

Here it holds true that:
v: The frequency-proportional wavenumber $1/\lambda$ having frequency coordinates $v_x$, $v_y$;
H: Roughness spectrum, that is to say the Fourier transformation of the object roughness h;
$\Theta(\vec{v})$: Aberration function of the optical unit, which is in turn defined as:

$$\Theta(\vec{v}) = (\sigma P \otimes \varphi_e P)(\vec{v}) - \sigma \varphi_e P \otimes P)(v\vec{v})$$

Here it holds true that:
$\sigma$: Intensity distribution of the illumination setting in a pupil plane;

P: Pupil transmission function of the optical unit, that is to say for example the effect of pupil limiting by an aperture and/or obscuration stop;

$\varphi_e$: The even wavefront aberration of the optical unit, that is to say an aberration contribution that can be described by an even function.

Figure 3:
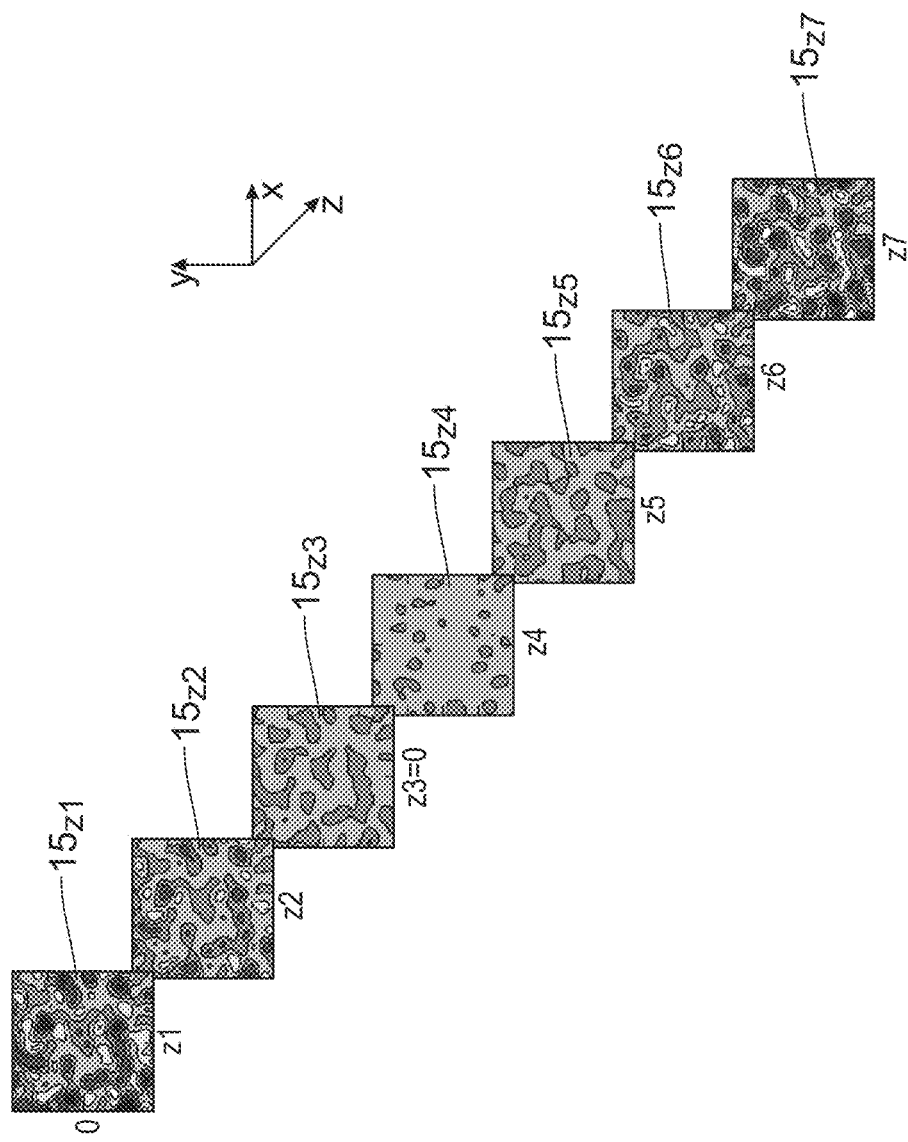
FIG. 3 shows a sequence of 2D intensity distributions in different measurement planes in the region of the image plane (focus stack), wherein this sequence represents a 3D aerial image which can be measured by the metrology system.
Figure 4:
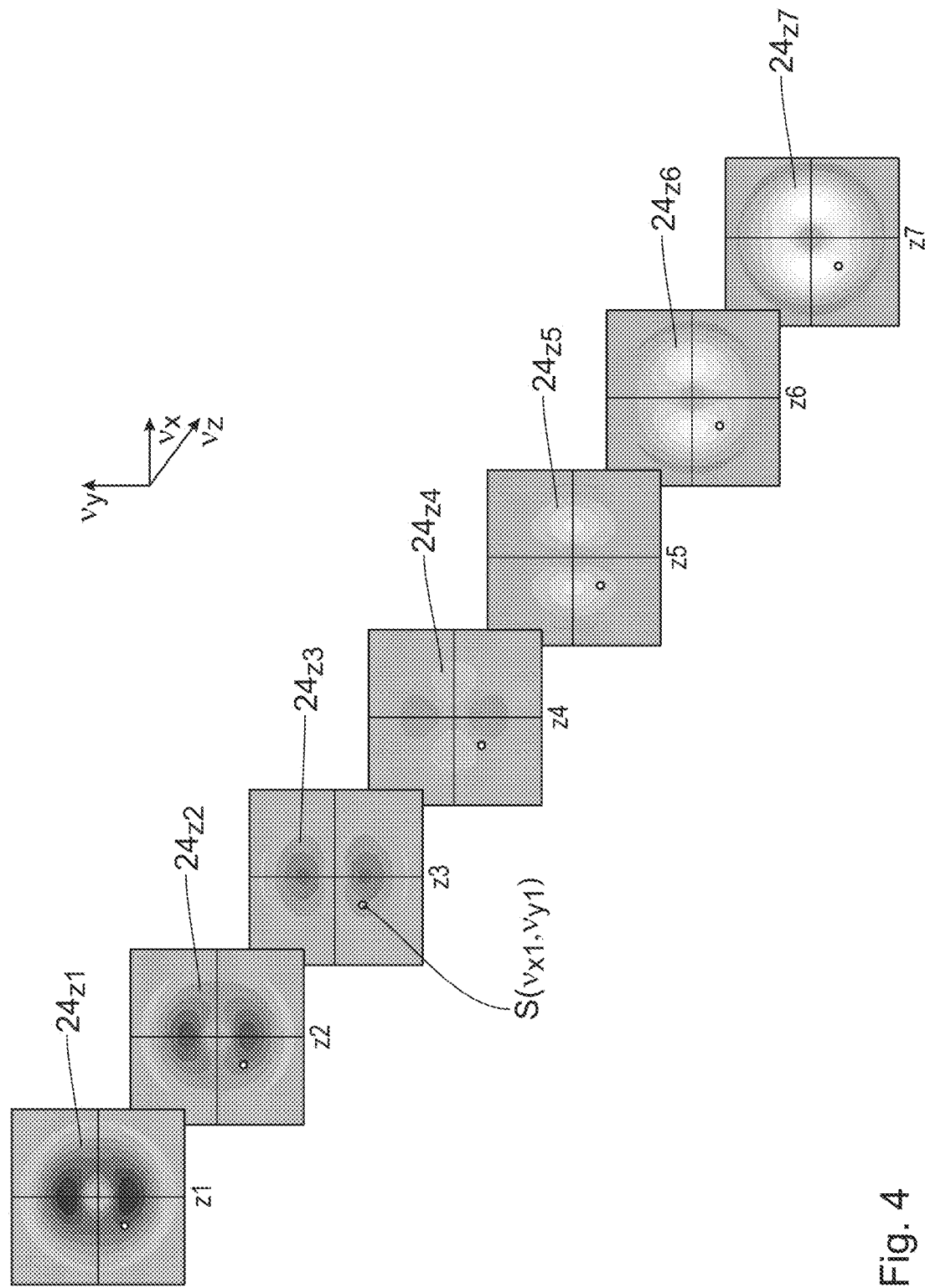
FIG. 4 shows, in a manner assigned to the sequence according to FIG. 3, a sequence of spectra of a speckle pattern of the 3D aerial image, determined by Fourier transformation of the 2D intensity distributions according to FIG. 3.
Figure 6:
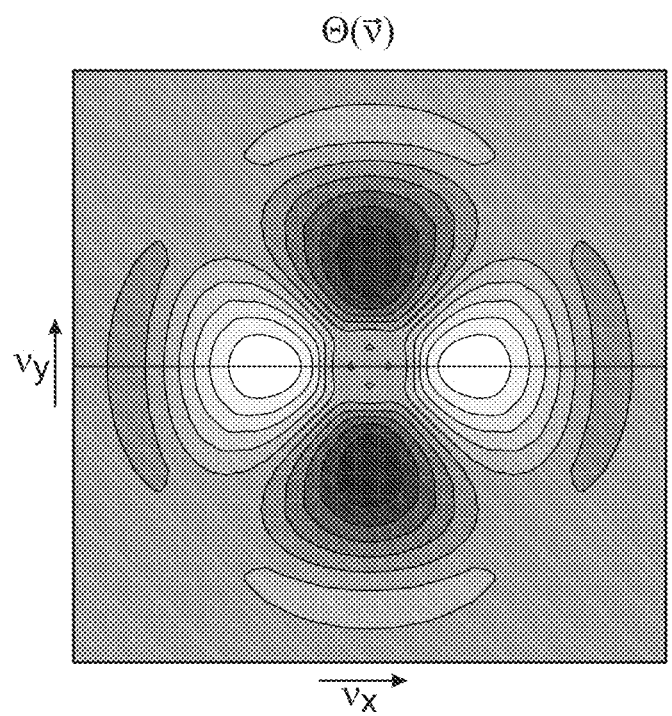
FIG. 6 shows by way of example an ascertained imaging aberration of the imaging optical unit of the metrology system, represented as a frequency-dependent aberration function, which imaging aberration arises as the result of a separation from specific values of the focus dependence of the spectral components in the manner of the spectral components according to FIG. 5.

A method for determining an imaging aberration contribution of the imaging optical unit 8 is explained below with reference to FIG. 3 et seq. The grey-scale values indicated in FIGS. 3, 4 and 6 are in each case a measure of the light intensity present at the location respectively considered.

What is carried out firstly is a focus-dependent measurement of the 3D aerial image 23 of the imaging optical unit 8 as a sequence of 2D intensity distributions $15_{z1}$ to $15_{z7}$ in different measurement planes z1 to z7 in the region parallel to the image plane 14 (z3=0) of the imaging of the object 5. In this case, in contrast to the illustration according to FIG. 1, what is imaged is not a structured object, but rather a (still) unstructured mask, that is to say a mask blank or a non-structured region of a mask. The aerial image that is recorded over the sequence of the 2D intensity distributions $15_{zi}$ shows a spatial distribution of speckles, which can be understood as the result firstly of a mask (remainder) structure contribution and of an imaging aberration contribution of the imaging optical unit 8.

This is then followed by determining the spectrum $S(\vec{v})$ of said speckle pattern of the 3D aerial image detected in the preceding step by Fourier transformation of the 2D intensity distributions $15_{zi}$. This results in a sequence of 2D speckle spectra $24_{z1}$ to $24_{z7}$, as a function of the frequency coordinates $v_x$ and $v_y$.

The sequence of the 2D intensity distributions $15_{z1}$ to $15_{z7}$ is also referred to as a focus stack.

Figure 5:
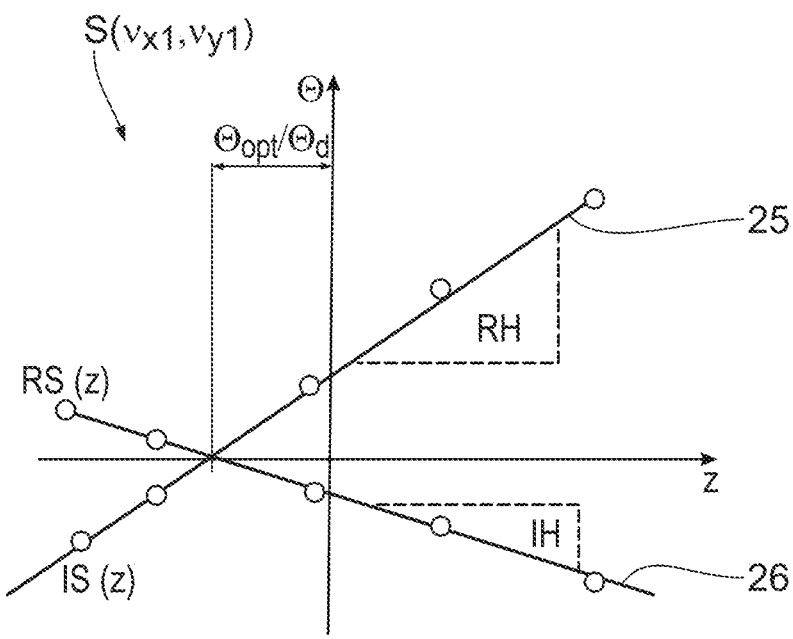
FIG. 5 shows schematic profiles of a real part and an imaginary part of a selected speckle component of the speckle pattern spectra according to FIG. 4 as a function of a focus position (z-direction perpendicular to the image plane)

Afterwards, for a plurality of spectral components $S(v_{xi}, v_{yi})$ in the frequency domain, a focus dependence of a real part RS(z) and an imaginary part IS(z) of this speckle spectral component $S(v_{xi}, v_{yi})$ is determined. This is illustrated for one spectral component $S(v_{xi}, v_{yi})$ highlighted by a selection point in FIG. 4. For this spectral component S, FIG. 5 schematically shows a linearly approximated profile 25 of the real part RS(z) of this speckle spectral component $S(v_{xi}, v_{yi})$ and a likewise linearly approximated profile 26 of the imaginary part IS(z) of this spectral component $S(v_{xi}, v_{yi})$, as a function of the z-coordinate, that is to say as a function of the focus position.

The following holds true for these z-dependencies of the speckle spectral component:

$$S(z) \sim H(\Theta_d z + \Theta_{opt})$$

Here it holds true that:
H: Contribution of the roughness of the object;
$\Theta_d$: Defocus aberration of the imaging optical unit;
$\Theta_{opt}$: Other imaging aberration contribution of the imaging optical unit.

The defocus aberration $\Theta_d$ of the imaging optical unit 8 can be calculated from the known illumination setting and the known transmission function of the optical unit. On the basis of the profiles 25 and 26 of the real part RS and the imaginary part IS, on the basis of the above formula it is possible to separate the imaging aberration contribution $\Theta$ from the roughness contribution H and the other imaging aberration $\Theta_{opt}$ of the imaging optical unit 8 then results after independent determination of the defocus aberration.

In particular the z-position of the intersection point between the profiles 25, 26 of the real part RS and the imaginary part IS can be used for this separation.

The imaging aberration contribution $\Theta_{opt}$ can be written in a frequency-dependent manner as an expansion in respect of Zernike aberration functions $\Theta_n$ having an expansion coefficient zn.

$$\Theta_{opt}(\vec{v}) = \frac{1}{\lambda} \sum_n z_n \Theta_n(\vec{v})$$

Here it holds true that:

$$\Theta_n(\vec{v}) = 2\pi(\sigma P \otimes Z_n P)(\vec{v}) - \sigma Z_n P \otimes P)(\vec{v})$$

with the Zernike polynomials $Z_n(\vec{v})$.

FIG. 6 shows the separated imaging aberration contribution $\Theta(\vec{v})$ by way of example. For the chosen illumination setting, this imaging aberration contribution has great similarity to the Zernike function Z5.

Figure 7:
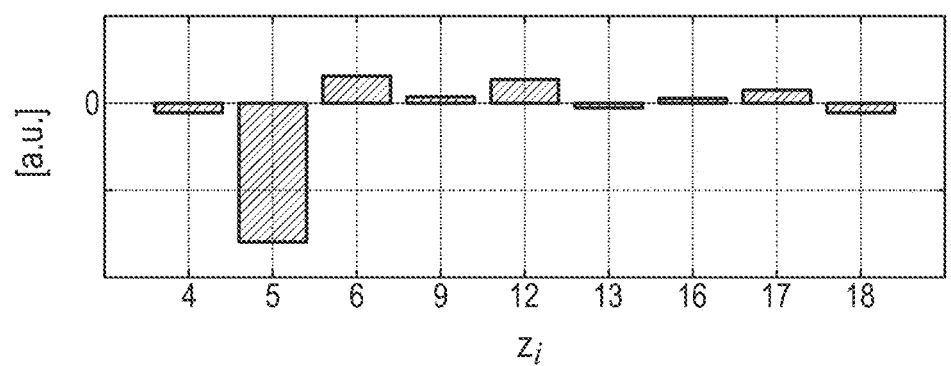
FIG. 7 shows a representation of the imaging aberration contribution according to FIG. 6 in the form of an expansion in respect of Zernike polynomials.

FIG. 7 shows the sequence of the coefficients $z_i$ of the above expansion formula for the Zernike functions Z4 to Z18. As expected the main contribution is manifested at the coefficient $z_5$ for the Zernike function Z5.

Overall, therefore, the imaging aberration contribution of the imaging optical unit 8 can be measured on the basis of the measurement of an unstructured location of the mask that is regularly required anyway in metrology. Said imaging aberration contribution can then be corrected by readjusting optical components of the imaging optical unit 8. For this purpose, the control device 11 can drive the displacement actuator 13 for the corresponding displacement of the imaging component 12. Such readjustment can be carried out in pauses in operation of the metrology system 2 or else during the operation of the metrology system 2. The readjustment can be carried out by open-loop control or else, by comparison between setpoint and actual values of respective imaging aberration contributions, by closed-loop control.

This expansion of the imaging aberration contribution by Zernike functions $Z_i$ constitutes one example of an expansion of the imaging aberration contribution over a linear combination of a set of orthogonal functions.

The optical set-up of the metrology system 2 serves for the most exact possible emulation of an illumination and an imaging in the course of a projection exposure of the object 5 during the projection-lithographic production of semiconductor components.

For details regarding the focus-dependent measurement of the 2D aerial image 23, reference is made to WO 2016/012426 A1. With regard to details in connection with Fourier transformation, too, reference is made to WO 2016/012426 A1 and the references mentioned therein.

The expansion of the imaging aberration contribution $\Theta_{opt}(\vec{v})$ by the Zernike functions $Z_i$ can be used directly for ascertaining a focus position of the lithography mask. The focus position or the defocus z is, in particular, a function of the fourth Zernike coefficient $Z_4$:

$$z = \frac{4Z_4}{NA^2}$$

As an alternative thereto, the defocus can be ascertained from the variance of the different aerial images of the focus stack. The variance of the aerial images of the focus stack is also referred to as speckle contrast.

The best focus position can be found by ascertaining the position for which the speckle contrast has a minimum. An interpolation method is provided for this purpose.

The above-described methods for determining the focus position of the lithography mask are suitable in particular for purely reflective structures, in particular multilayer structures, in particular mask blanks, and purely absorbent structures. The methods are in particular independent of specific measurement structures. Measurement structures of this type are not required. The methods are furthermore implementable in a simple manner and very robust. They are in particular reliably reproducible.

They can be used to determine and correct the global focus position of a mask, spatial variations of the focus position, e.g. as a result of bending of the mask or drifts of the focus position.

In principle, the above-outlined method for determining the focus position of the mask can also be used in a projection exposure system for imaging the mask onto a wafer. It can be used in particular to align the mask position in such a projection exposure system. The imaging of the mask onto the wafer and thus the structures producible on the wafer and thus the wafer itself can be improved as a result.

The features described above related to processing of data can be implemented by the image processing device 10, or be implemented in digital electronic circuitry, or in computer hardware, firmware, software, or in combinations of them. The features related to processing of data includes, e.g., evaluate 2D intensity distributions of the recorded focus stack in a spatially resolved manner, ascertain the speckle contrast, and ascertain a focus position (z) for which the speckle contrast has a minimum. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the imaging processing device 10 is suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for determining a focus position of a lithography mask described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A method for determining a focus position of a lithography mask, the method comprising the following steps:
   1.1. providing an optical system having an imaging optical unit for imaging lithography masks,
   1.2. providing a lithography mask having at least one measurement region which is free of structures to be imaged,
   1.3. recording a focus stack of the at least one measurement region of the lithography mask,
   1.4. evaluating 2D intensity distributions of the recorded focus stack in a spatially resolved manner,
   1.5. wherein evaluating the 2D intensity distributions comprises ascertaining the speckle contrast, and
   1.6. wherein evaluating the 2D intensity distributions comprises ascertaining a focus position (z) for which the speckle contrast has a minimum;
   wherein ascertaining the focus position for which the speckle contrast has a minimum comprises an interpolation method.

2. The method according to claim 1, wherein evaluating the 2D intensity distributions comprises the following steps:
   3.1. determining a spectrum $S(\vec{v}, z)$ of the 2D intensity distributions by Fourier transformation of the 2D intensity distributions,
   3.2. determining a focus dependence of a real part $RS(z)$ and an imaginary part $IS(z)$ of a plurality of spectral components $S(v_{xi}, v_{yi})$ of the spectrum $(\vec{v}, z)$ in the frequency domain,
   3.3. separating an imaging aberration contribution $(\Theta_{opt})$ made to the spectrum $S(\vec{v}, z)$ by the imaging optical unit, and
   3.4. representing the imaging aberration contribution $(\Theta_{opt})$ as a linear combination of Zernike polynomials $Z_n(\vec{v})$.

3. The method according to claim 2, wherein representing the imaging aberration contribution $(\Theta_{opt})$ as a linear combination of Zernike polynomials comprises ascertaining Zernike coefficients $Z_n$.

4. The method according to claim 3, wherein a linear regression method (least square fit) is used for ascertaining the symmetrical Zernike coefficients $Z_n$.

5. The method according to claim 2, wherein the focus position is ascertained directly from the fourth Zernike coefficient $Z_4$.

6. The method according to claim 1, wherein the evaluating comprises exclusively Fourier transformations and linear algebra.

7. The method according to claim 1, wherein a mirror-symmetrical illumination setting is used for illuminating the measurement region.

8. The method according to claim 1, wherein at least partially coherent illumination radiation is used for illuminating the measurement region.

9. The method according to claim 1, wherein coherent illumination radiation is used for illuminating the measurement region.

10. A metrology system for carrying out a method according to claim 1, the system comprising an illumination optical unit for illuminating the measurement region with illumination radiation and comprising an imaging optical unit for imaging the measurement region onto a spatially resolving detection device.

11. The metrology system according to claim 10, wherein for evaluating the 2D intensity distributions of the recorded focus stack, a computing device is connected to the detection device in a data-transferring manner.

12. The metrology system of claim 11 in which the computing device is configured to evaluate the 2D intensity distributions of the recorded focus stack in a spatially resolved manner and ascertain the focus position (z) for which the speckle contrast has a minimum.

13. The metrology system of claim 11 in which the computing device is configured to use the interpolation method to ascertain the focus position for which the speckle contrast has a minimum.

14. The metrology system of claim 13 in which the computing device is configured to evaluate the 2D intensity distributions by performing the following steps:
   determining a spectrum $S(\vec{v}, z)$ of the 2D intensity distributions by Fourier transformation of the 2D intensity distributions,
   determining a focus dependence of a real part $RS(z)$ and an imaginary part $IS(z)$ of a plurality of spectral components $S(v_{xi}, v_{yi})$ of the spectrum $(\vec{v}, z)$ in the frequency domain,
   separating an imaging aberration contribution $(\Theta_{opt})$ made to the spectrum $S(\vec{v}, z)$ by the imaging optical unit, and
   representing the imaging aberration contribution $(\Theta_{opt})$ as a linear combination of Zernike polynomials $Z_n(\vec{v})$.

15. The metrology system of claim 14 in which the computing device is configured to represent the imaging aberration contribution $(\Theta_{opt})$ as a linear combination of Zernike polynomials by ascertaining Zernike coefficients $Z_n$.

16. The metrology system of claim 15 in which the computing device is configured to use a linear regression method (least square fit) for ascertaining the symmetrical Zernike coefficients $Z_n$.

17. The metrology system of claim 14 in which the computing device is configured to ascertain the focus position directly from the fourth Zernike coefficient $Z_4$.

18. The metrology system of claim 11 in which the computing device is configured to evaluate the 2D intensity distributions using Fourier transformations and linear algebra.

19. A method for imaging a lithography mask onto a wafer, in which the lithography mask comprises a structure to be imaged and at least one measurement region that is free of structures to be imaged, the method comprising:
   determining a focus position of the lithography mask, comprising the following steps:
      providing an optical system having an imaging optical unit for imaging lithography masks,
      recording a focus stack of the at least one measurement region of the lithography mask,
      evaluating 2D intensity distributions of the recorded focus stack in a spatially resolved manner,
      wherein evaluating the 2D intensity distributions comprises ascertaining the speckle contrast, and
      wherein evaluating the 2D intensity distributions comprises ascertaining a focus position (z) for which the speckle contrast has a minimum, aligning a position of the lithography mask in a projection exposure system according to the determined focus position of the lithography mask, and exposing the lithography mask to transfer the structure to be imaged onto the wafer, wherein ascertaining the focus position for which the speckle contrast has a minimum comprises an interpolation method.

* * * * *

UNITED STATES PATENT AND TRADEMARK OFFICE
CERTIFICATE OF CORRECTION

PATENT NO. : 10,564,551 B2  
APPLICATION NO. : 16/280521  
DATED : February 18, 2020  
INVENTOR(S) : Markus Koch et al.

Page 1 of 1

It is certified that error appears in the above-identified patent and that said Letters Patent is hereby corrected as shown below:

In the Specification

Column 1  
Line 56, delete "(15m)" and insert -- $(15_{zi})$ --

Column 6  
Line 11, delete "α(κ)" and insert -- σ(κ) --

Line 64, delete "$\Theta(\vec{v}) = (\sigma P \otimes \varphi_e P)(\vec{v}) - \sigma \varphi_e P \otimes P)(\vec{vv})$," and insert $$\Theta(\vec{v}) = (\sigma P \otimes \varphi_e P)(\vec{v}) - (\sigma \varphi_e P \otimes P)(\vec{v})$$

Column 8  
Line 4, delete "zn" and insert -- $z_n$ --

Line 14, delete "$\Theta_n(\vec{v}) = 2\pi(\sigma P \otimes Z_n P)(\vec{v}) - \sigma Z_n P \otimes P)(\vec{v})$," and insert $$\Theta_n(\vec{v}) = 2\pi(\sigma P \otimes Z_n P)(\vec{v}) - (\sigma Z_n P \otimes P)(\vec{v})$$

Signed and Sealed this  
Ninth Day of June, 2020

Andrei Iancu  
*Director of the United States Patent and Trademark Office*